United States Patent
Kunitou

Patent Number: 5,960,287
Date of Patent: Sep. 28, 1999

[54] METHOD FOR MANUFACTURING SEMICONDUCTOR MEMORY DEVICES HAVING A ROM DEVICE

[75] Inventor: Masao Kunitou, Tokyo, Japan

[73] Assignee: NEC Corporation, Japan

[21] Appl. No.: 08/924,075

[22] Filed: Aug. 28, 1997

[30] Foreign Application Priority Data

Aug. 30, 1996 [JP] Japan .................................. 8-248920

[51] Int. Cl.[6] .............................................. H01L 21/8246
[52] U.S. Cl. ........................... 438/275; 438/278; 438/760
[58] Field of Search ........................... 438/238, 275–279, 438/128, 760

[56] References Cited

U.S. PATENT DOCUMENTS 5,597,753  1/1997  Sheu et al. .
5,792,697  9/1998  Wen ........................................ 438/275

Primary Examiner—Jey Tsai

[57] ABSTRACT

In a conventional method, formation of an intermediate layer to serve as an insulating layer between a metal terminal on the surface of the device and a gate electrode of the device, along with heat treatment of the intermediate layer, is executed after formation of implanted diffusion layers to serve as bit lines of the device. In the method for manufacturing semiconductor memory devices according to the present invention, formation of the intermediate layer and heat treatment thereof are executed before formation of the implanted diffusion layers. The formation of the implanted diffusion layers is executed by introducing an impurity material into a memory cell region of the device with an energy enough to penetrate the intermediate layer. According to the method, heat diffusion of the impurity material due to the heat treatment step is prevented, and thus 'Lmin', i.e. the minimun channel length, can be set shorter and higher degree of integration of devices is made possible. Moreover, the impurity material is also introduced in a calipers region of the device. Part of the intermediate layer on the calipers region is removed and the impurity material in the calipers region is oxidized so as to form a calipers pattern. By the calipers pattern, positioning of the photoresist layer used in the data writing process can be executed with high precision, and thus manufacturing process yields of devices can be raised.

10 Claims, 5 Drawing Sheets

5,960,287

METHOD FOR MANUFACTURING SEMICONDUCTOR MEMORY DEVICES HAVING A ROM DEVICE

BACKGROUND OF THE INVENTION

The present invention relates to a method for manufacturing semiconductor devices, and in particular, to a method preferable for manufacturing semiconductor memory devices.

Description of the Prior Art

FIG. 1A through FIG. 1G are schematic sectional diagrams depicting the steps involved in the conventional method for manufacturing nonvolatile semiconductor memory devices such as mask ROMs in the order of processes.

Referring first to FIG. 1A, in the first step, a silicon oxide ($SiO_2$) layer 102 approximately 20 nm thick as a pad oxide layer is formed on a P-type semiconductor substrate 101. Subsequently, silicon nitride layers 103 approximately 120 nm thick are formed on the silicon oxide layer 102 in a memory cell region 104 and a calipers region 105.

Referring next to FIG. 1B, in the subsequent step, using the silicon nitride layers 103 as masks, part of the P-type semiconductor substrate 101 other than the memory cell region 104 and the calipers region 105 is oxidized so as to form a field oxide layer 106 which is approximately 400–500 nm thick.

Referring further to FIG. 1C, in the subsequent step, using a photoresist layer 107 as a mask, part of the silicon nitride layers 103 in the memory cell region 104 and the calipers region 105 is removed so as to form openings and residual silicon nitride layers 108. Then using the mask, a N-type impurity material such as arsenic is introduced in the P-type semiconductor substrate 101 by means of ion implantation in approximately 70–100 KeV and $1.0$–$2.0 \times 10^{15} cm^{-2}$ so as to form implanted $N^+$ diffusion layers 109 to serve as bit lines of the semiconductor memory device.

Referring further to FIG. 1D, in the subsequent step, the photoresist layer 107 is removed, and then using the silicon nitride layers 108 as masks, the memory cell region 104 and the calipers region 105 are oxidized in an atmosphere of $H_2O_2$ at a temperature of about 800–900° C. so as to form arsenic oxide layers 110 of a thickness of approximately 100–150 nm.

Referring further to FIG. 1E, in the subsequent step, a P-type impurity material such as boron is introduced in the P-type semiconductor substrate 101 by means of ion implantation in approximately 150–200 KeV and $4.0$–$5.0 \times 10^{13} cm^{-2}$ so as to form a P-type well 111. Subsequently, a gate oxide insulator layer 112 is formed by means of thermal oxidation, then a polycrystal silicon layers 113 and a tungsten silicide layers 114 are patterned on the memory cell region 104 so as to form gate electrodes or word lines of the semiconductor memory device. At this step, the polycrystal silicon layers 113 and the tungsten silicide layers 114 in the memory cell region 104 are patterned on the gate oxide insulator layer 112 so as to be substantially oriented at a right angle with respect to the implanted $N^+$ diffusion layers 109 formed in the foregoing step.

Referring further to FIG. 1F, in the subsequent step, an intermediate layer 115 of a thickness of about 400–500 nm is deposited by CVD (chemical vapor deposition) method. Subsequently, heat treatment for reflowing the surface of the intermediate layer 115 and flattening it is executed in an atmosphere of nitrogen at a temperature of about 900–1000° C. for about 30 minutes. Then contact holes 118 are formed in the intermediate layer 115. Incidentally, in a step after FIG. 1G, a metal terminal made of aluminum etc. is formed on the surface of the intermediate layer 115. The metal terminal and the gate electrode (the polycrystal silicon layer 113 and the tungsten silicide layer 114) is electrically connected via the contact hole 118. The 'intermediate' layer 115 serves as an insulating layer between the metal terminal and the gate electrode.

Referring further to FIG. 1G, in the subsequent step, data is written from above the intermediate layer 115 using a photoresist layer 116 as a mask. The writing of the data is executed by introducing P-type impurity material such as boron in approximately 300–400 KeV and $1.0$–$3.0 \times 10^{14} cm^{-2}$ and thereby forming P-type code injection layers 117. The P-type code injection layer 19 serves as data such as '0' or '1' written in the channel region of the semiconductor memory device.

At this step, confirmation of positioning of the photoresist layer 116 is executed by watching and confirming that the calipers formed of the arsenic oxide layers 110 in the calipers region 105 are exactly under corresponding holes formed in the photoresist layer 116. If the position of the photoresist layer 116 is not correct, the photoresist layer 116 is removed and formed again.

However, the conventional method for manufacturing semiconductor memory device has the following drawbacks.

First, positioning of the photoresist layer 116 used in the data writing process can not be executed with high precision. The intermediate layer 115 is covering the arsenic oxide layers 110, and thus precision on the confirmation of the position of the photoresist layer 116 executed by watching the calipers made of the arsenic oxide layers 110 in the calipers region 105 under the intermediate layer 115 is necessitated to be lowered. Therefore, precision on the data writing process can not be maintained in a high level, and thus manufacturing process yields of semiconductor memory devices is deteriorated.

Second, the implanted $N^+$ diffusion layer 109 to serve as a bit line of the semiconductor memory device diffuses during the following heat treatment process, and thus the value 'Lmin' of a semiconductor memory device, i.e. the minimun channel length which can be set or predetermined in the semiconductor memory device, is necessitated to be longer. Therefore, further miniaturization or higher degree of integration of semiconductor memory devices is difficult.

SUMMARY OF THE INVENTION

It is therefore the primary object of the present invention to provide a method for manufacturing semiconductor memory device by which deterioration of Lmin can be prevented and further miniaturization or higher degree of integration of semiconductor memory devices is made possible.

Another object of the present invention is to provide a method for manufacturing semiconductor memory device by which precision of positioning of the photoresist layer used in the data writing process is improved and manufacturing process yields of the semiconductor memory device is raised.

In accordance with the present invention, there is provided a method for manufacturing semiconductor memory devices comprising three steps. In the first step, an intermediate layer as an insulating layer between a metal terminal on the surface of the device and a gate electrode of the device is formed. In the second step, heat treatment for reflowing the surface of the intermediate layer and flattening the surface of the intermediate layer is executed. In the third step, an impurity material is introduced into a memory cell region of the device with an energy enough to penetrate the intermediate layer so as to form implanted diffusion layers to serve as bit lines of the device, after the above heat treatment step, thereby heat diffusion of the impurity material due to the heat treatment step is prevented.

Preferably, along with the introduction of the impurity material into the memory cell region in the above third step, the impurity material is introduced into a calipers region of the device. Subsequently, part of the intermediate layer in the calipers region is removed so as to form an opening. Subsequently, oxidation of the impurity material in the calipers region is executed through the opening so as to form a calipers pattern. Then, positioning of a photoresist layer is executed using the calipers pattern, and data is written into the memory cell region using the photoresist layer as a mask.

In accordance with another aspect of the present invention, there is provided a method for manufacturing semiconductor memory devices comprising nine steps. In the first step, a device formation region including a pad oxide layer on the surface of a semiconductor substrate of a first type is formed. In the second step, a device separation region dividing the device formation region is formed. In the third step, a first ion implantation of an impurity material of the first type is executed into the device formation region with an energy enough for the impurity material to reach the semiconductor substrate. In the fourth step, the pad oxide layer is removed, a gate oxide insulator layer in the device formation region is formed, and a gate electrode in the device formation region is formed. In the fifth step, an intermediate layer is formed on the entire top surface of the above structure. In the sixth step, a second ion implantation of an impurity material of the second type opposite to the first type is executed into the device formation region with an energy enough for the impurity material to penetrate the intermediate layer, the gate electrode, and the gate oxide insulator layer and reach the semiconductor substrate, so as to form an implanted diffusion layer of the second type. In the seventh step, part of the intermediate layer in the calipers region is removed so as to form an opening, and oxidation of the impurity material in the calipers region is executed through the opening so as to form a calipers pattern. In the eighth step, positioning of a photoresist layer is executed using the calipers pattern. In the ninth step, a third ion implantation of an impurity material of the first type is executed into part of the device formation region underneath the gate electrode with an energy enough for the impurity material to penetrate the gate electrode and the gate oxide insulator layer and reach the semiconductor substrate, using the photoresist layer as a mask.

Preferably, the semiconductor substrate is P-type, the impurity material in the first ion implantation is boron, the impurity material in the second ion implantation is arsenic, the implanted diffusion layer is N-type, and the impurity material in the third ion implantation is boron.

Preferably, the semiconductor substrate is N-type, the implanted diffusion layer is P-type, and the impurity material in the third ion implantation is phosphorus.

Preferably, the gate electrode is substantially oriented at a right angle with respect to the implanted diffusion layer formed in the second ion implantation.

Preferably, a plurality of the implanted diffusion layers are arranged substantially parallel-spaced at equal intervals.

Preferably, a plurality of the gate electrodes are arranged substantially parallel-spaced at equal intervals.

Preferably, a silicon nitride layer is deposited on the intermediate layer before the oxidation of the impurity material in the calipers region.

Preferably, the gate electrode is comprised of a polycrystal silicon layer and tungsten silicide layer.

BRIEF DESCRIPTION OF THE DRAWINGS

The objects and features of the present invention will become more apparent from the consideration of the following detailed description taken in conjunction with the accompanying drawings, in which:

FIGS. 1A through FIG. 2G are schematic sectional diagrams depicting steps involved in the conventional method for manufacturing nonvolatile semiconductor memory devices in the order of processes; and FIGS. 2A through FIG. 2I are schematic sectional diagrams depicting steps involved in the method for manufacturing nonvolatile semiconductor memory devices according to an embodiment of the present invention in the order of processes.

DESCRIPTION OF THE PREFERRED EMBODIMENTS

Figure 1A:
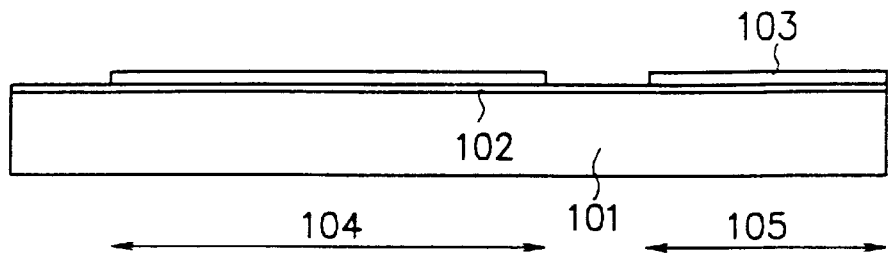
Figure 1B:
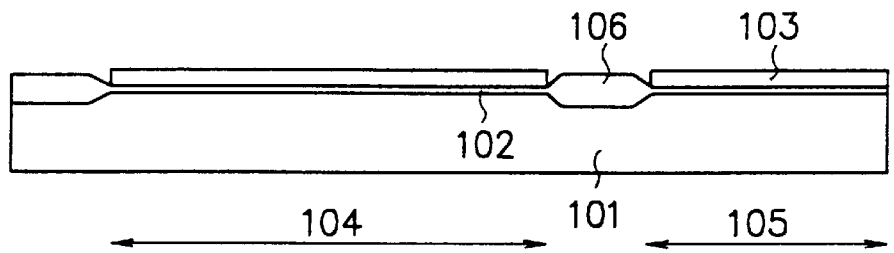
Figure 1C:
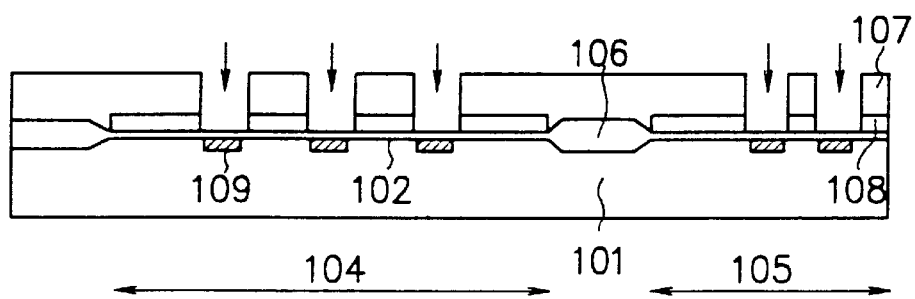
Figure 1D:
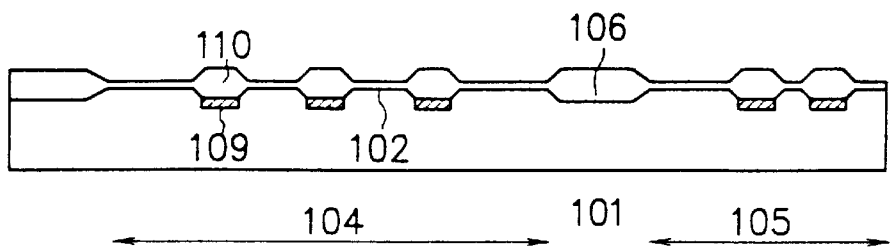
Figure 1E:
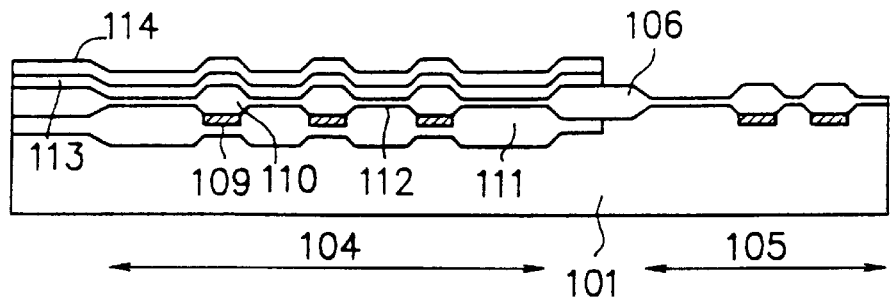
Figure 1F:
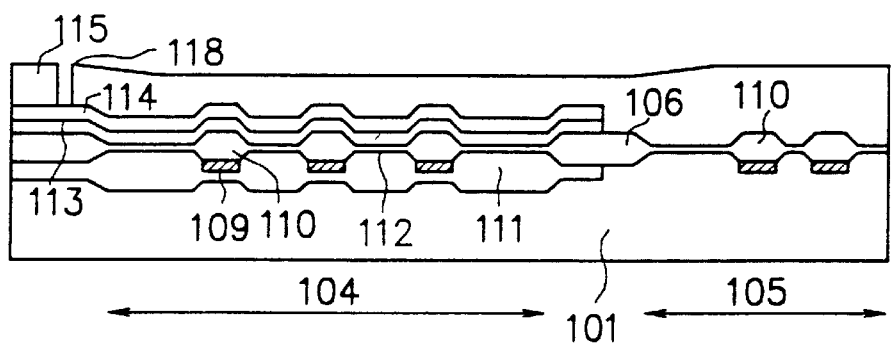
Figure 1G:
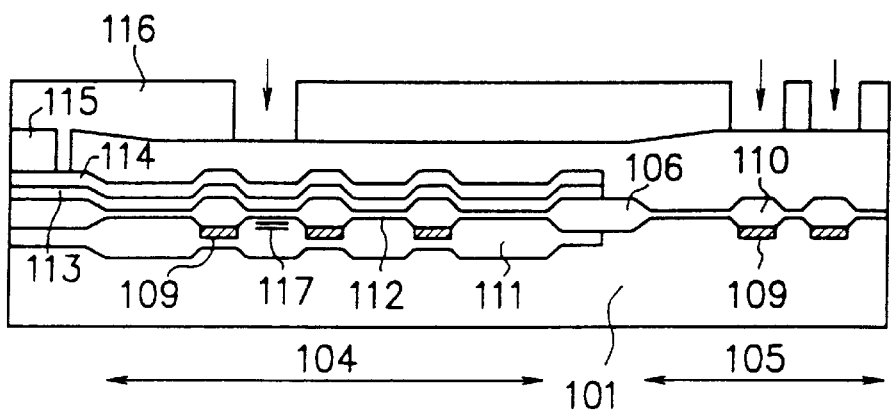

Referring now to the drawings, a description will be given in detail of a preferred embodiment according to the present invention.

FIGS. 2A through FIG. 2I are schematic sectional diagrams depicting the steps involved in the method for manufacturing semiconductor memory devices according to an embodiment of the present invention in the order of processes.

Figure 2A:
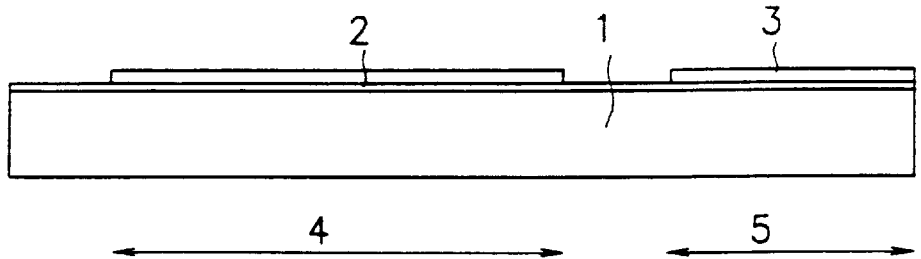

Referring first to FIG. 2A, in the first step, a silicon oxide ($SiO_2$) layer 2 approximately 20 nm thick as a pad oxide layer is formed on a P-type semiconductor substrate 1. Subsequently, silicon nitride layers 3 approximately 120 nm thick are formed on the silicon oxide layer 2 in a memory cell region 4 and a calipers region 5.

Figure 2B:
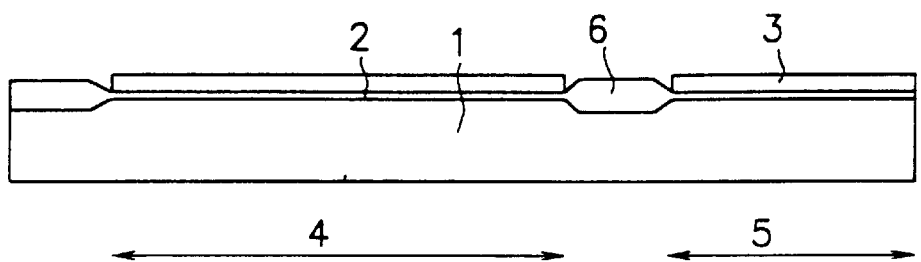

Referring next to FIG. 2B, in the subsequent step, using the silicon nitride layers 3 as masks, part of the surface of the P-type semiconductor substrate 1 other than the memory cell region 4 and the calipers region 5 is oxidized so as to form a field oxide layer 6 which is approximately 400–500 nm thick. Then, the silicon nitride layers 3 are removed.

Figure 2C:
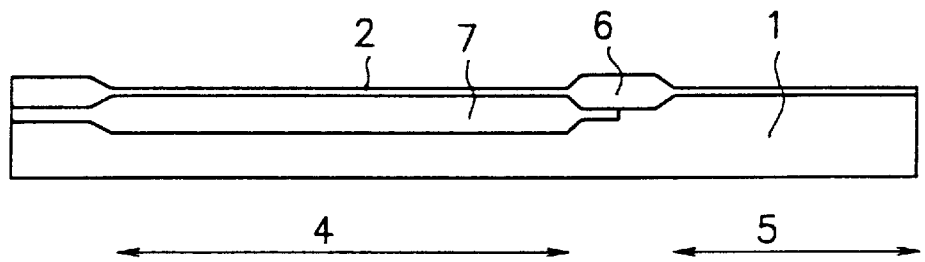

Referring further to FIG. 2C, in the subsequent step, a P-type impurity material such as boron is introduced in the memory cell region 4 by means of ion implantation in approximately 150–200 KeV and $3.0–5.0\times10^{13} cm^{-2}$ so as to form a P-type well 7.

Figure 2D:
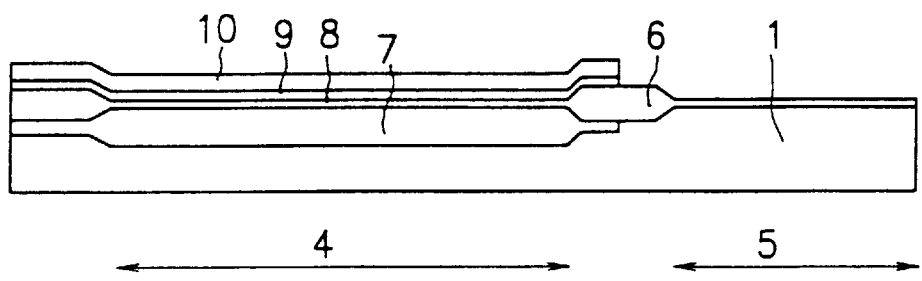

Referring further to FIG. 2D, in the subsequent step, after removing the silicon oxide layer 2, a gate oxide insulator layer 8 is formed by means of thermal oxidation, then polycrystal silicon layers 9 and tungsten silicide layers 10 are patterned on the memory cell region 4 so as to form gate electrodes or word lined of the semiconductor memory device.

Figure 2E:
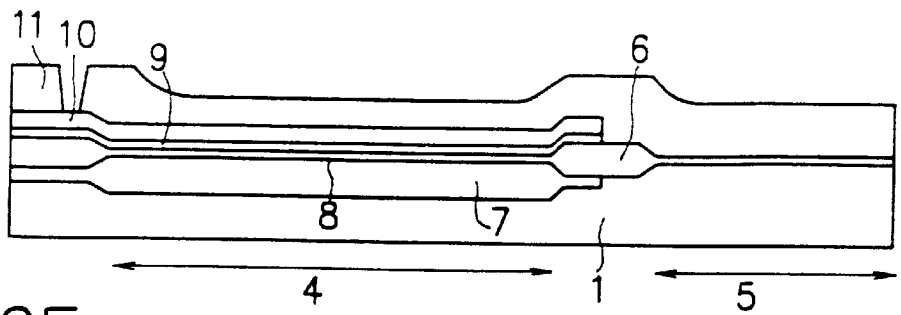

Referring further to FIG. 2E, in the subsequent step, an intermediate layer 11 of a thickness of about 400–500 nm is deposited by CVD method. Subsequently, heat treatment for reflowing the surface of the intermediate layer 11 and flattening it is executed in an atmosphere of nitrogen at a temperature of about 900–1000° C. for about 30 minutes. Then contact holes are formed in the intermediate layer 11.

Figure 2F:
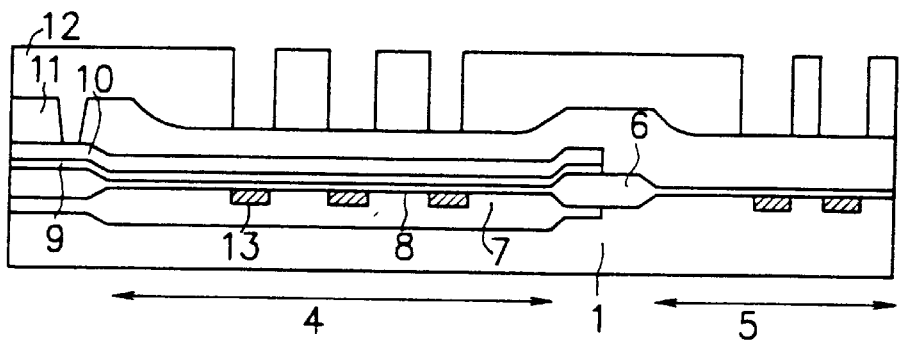
Figure 2G:
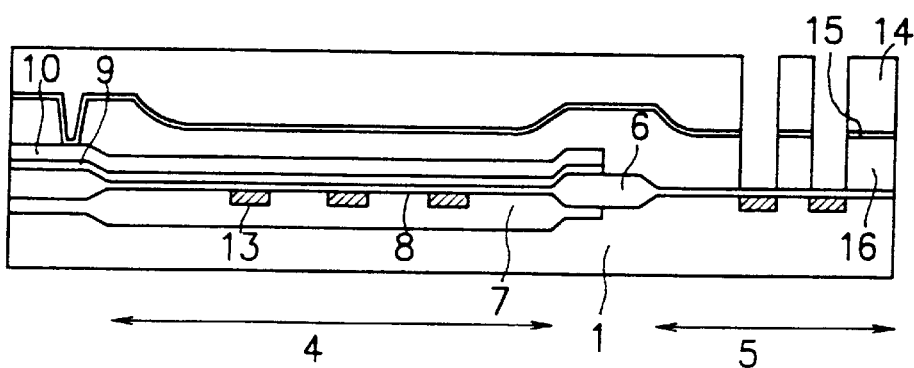
Figure 2H:
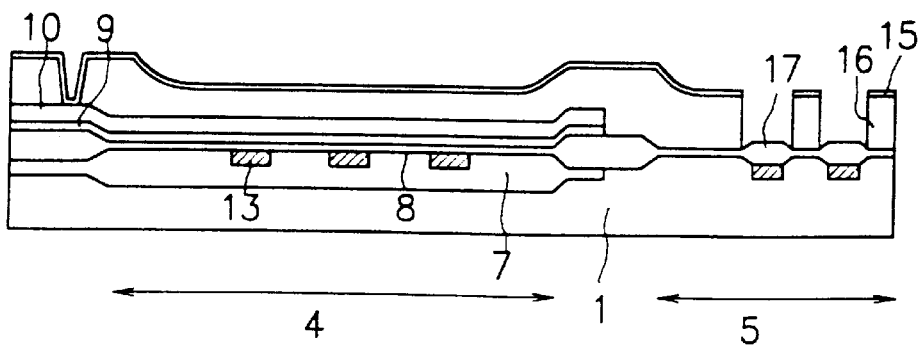
Figure 2I:
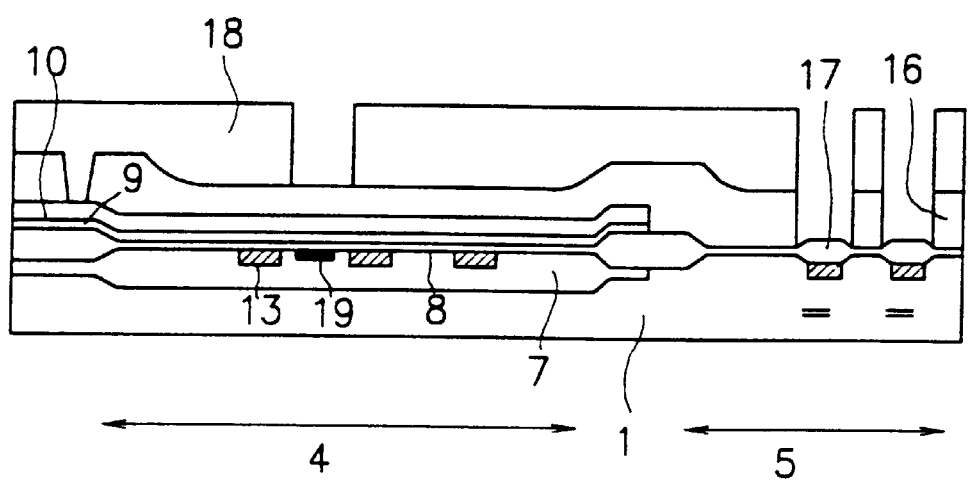

Incidentally, in a step after FIG. 2I, a metal terminal made of aluminum etc. is formed on the surface of the intermediate layer 11, and the metal terminal and the gate electrode (the polycrystal silicon layer 9 and the tungsten silicide layer 10) is electrically connected via the contact hole. The 'intermediate' layer 11 serves as an insulating layer between the metal terminal and the gate electrode.

Referring further to FIG. 2F, in the subsequent step, using a photoresist layer 12 over the intermediate layer 11 as a mask, a N-type impurity material such as arsenic is introduced in the memory cell region 4 and the calipers region 5 by means of ion implantation with an energy enough to penetrate the intermediate layer 11, the tungsten silicide layer 10, and the polycrystal silicon layer 9 i.e. approximately 1.0–1.5 MeV and $1.0$–$2.0\times10^5 cm^{-2}$ so as to form implanted $N^+$ diffusion layers 13 to serve as bit lines of the semiconductor memory device.

At this step, the implanted $N^+$ diffusion layers 13 in the memory cell region 4 are patterned under the gate oxide insulator layer 8 so as to be substantially oriented at a right angle with respect to the tungsten silicide layers 10 and the polycrystal silicon layers 9 which are formed in the foregoing step.

Referring further to FIG. 2G, in the subsequent step, a silicon nitride layer 15 of a thickness of about 10–15 nm is deposited by CVD method on the intermediate layer 11. Subsequently, using a photoresist layer 14 as a mask, part of the silicon nitride layer 15 and the intermediate layer 11 in the calipers region 5 is removed and openings are formed.

Referring further to FIG. 2H, in the subsequent step, after removing the photoresist layer 14, the calipers region 5 is oxidized through the openings in an atmosphere of $H_2O_2$ at a temperature of about 800–900° C. so as to form arsenic oxide layers 17 of a thickness of approximately 100 nm. These arsenic oxide layers 17 in the calipers region 5 will serve as calipers to be used in the following data writing process.

Referring further to FIG. 2I, in the subsequent step, after removing the silicon nitride layer 15, data is written from above the intermediate layer 11 using a photoresist layer 18 as a mask. The writing of the data is executed by introducing P-type impurity material such as boron in approximately 300–400 KeV and $1.0$–$3.0\times10^4 cm^{-2}$ and thereby forming P-type code injection layers 19. The P-type code injection layer 19 serves as data such as '0' or '1' written in the channel region of the semiconductor memory device.

Incidentally, the photoresist layer 18 is generally formed by the following process. First, photoresist material is applied on top of the intermediate layer 11. Subsequently, by means of position control of a stepper exposure apparatus, etc., specific parts of the applied photoresist layer are irradiated and specific parts are removed so as to form openings in the photoresist layer 18. Then, it is confirmed whether or not the positioning of the photoresist layer 18 is correct and the openings of the photoresist layer 18 are correctly on the calipers made of arsenic oxide layers 17 in the calipers region 5. If the positioning of the photoresist layer 18 is correct, the formation of the P-type code injection layer 19 using the photoresist layer 18 as a mask is executed. If the positioning of the photoresist layer 18 is incorrect, the photoresist layer 18 is removed and another photoresist layer 18 is formed again.

In this embodiment, confirmation of the positioning of the photoresist layer 18 is performed by watching the arsenic oxide layers 17 in the calipers region 5 as calipers without any layers covering the arsenic oxide layers 17. Therefore, precision of the positioning of the photoresist layer 18 used in the data writing process is remarkably higher than the conventional method.

Moreover, the implanted $N^+$ diffusion layers 13 to serve as bit lines are formed after the formation of the intermediate layer 11 and the following heat treatment process thereof. Therefore, diffusion of the impurity material during the heat treatment process is avoided and the Lmin can be improved i.e. shortened.

As set forth hereinabove, in the method for manufacturing semiconductor memory devices according to the present invention, deterioration of 'Lmin' of a semiconductor memory device, i.e. the minimun channel length which can be set or predetermined in the semiconductor memory device, is prevented. Therefore, further miniaturization or higher degree of integration of semiconductor memory devices is made possible.

Moreover, positioning of the photoresist layer used in the data writing process can be executed with high precision. Therefore, precision on the data writing process can be maintained in a high level, and thus manufacturing process yields of semiconductor memory devices can be raised.

Incidentally, although method for manufacturing ROMs has been described above, the method for manufacturing semiconductor memory devices according to the present invention can be applied in other types of semiconductor memory devices such as random access memories, except for the step associated to the data writing process.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A method for manufacturing semiconductor memory devices comprising the steps of:

(1) forming an intermediate layer as an insulating layer between a metal terminal on the surface of the device and a gate electrode of the device;

(2) executing heat treatment for reflowing the surface of the intermediate layer and flattening the surface of the intermediate layer;

(3) introducing an impurity material into a memory cell region of the device with an energy enough to penetrate the intermediate layer so as to form implanted diffusion layers to serve as bit lines of the device after the above heat treatment step, thereby preventing heat diffusion of the impurity material due to the heat treatment step.

2. A method for manufacturing semiconductor memory devices as claimed in claim 1, further comprising the steps of:

(a) introducing the impurity material into a calipers region of the device, along with the introduction of the impurity material into the memory cell region in the step (3);

(b) removing part of the intermediate layer in the calipers region so as to form an opening;

(c) executing oxidation of the impurity material in the calipers region through the opening so as to form a calipers pattern;

(d) executing positioning of a photoresist layer using the calipers pattern; and (e) writing data into the memory cell region using the photoresist layer as a mask.

3. A method for manufacturing semiconductor memory devices comprising the steps of:

(1) forming a device formation region including a pad oxide layer on the surface of a semiconductor substrate of a first type;

(2) forming a device separation region dividing the device formation region;

(3) executing a first ion implantation of an impurity material of the first type into the device formation region with an energy enough for the impurity material to reach the semiconductor substrate;

(4) removing the pad oxide layer, forming a gate oxide insulator layer in the device formation region, and forming a gate electrode in the device formation region;

(5) forming an intermediate layer on the entire top surface of the above structure;

(6) executing a second ion implantation of an impurity material of the second type opposite to the first type into the device formation region with an energy enough for the impurity material to penetrate the intermediate layer, the gate electrode, and the gate oxide insulator layer and reach the semiconductor substrate, so as to form an implanted diffusion layer of the second type;

(7) removing part of the intermediate layer in the calipers region so as to form an opening, and executing oxidation of the impurity material in the calipers region through the opening so as to form a calipers pattern;

(8) executing positioning of a photoresist layer using the calipers pattern; and (9) executing a third ion implantation of an impurity material of the first type into part of the device formation region underneath the gate electrode with an energy enough for the impurity material to penetrate the gate electrode and the gate oxide insulator layer and reach the semiconductor substrate using the photoresist layer as a mask.

4. A method for manufacturing semiconductor memory devices as claimed in claim 3, wherein the semiconductor substrate is P-type, the impurity material in the first ion implantation is boron, the impurity material ill the second ion implantation is arsenic, the implanted diffusion layer is N-type, and the impurity material in the third ion implantation is boron.

5. A method for manufacturing semiconductor memory devices as claimed in claim 3, wherein the semiconductor substrate is N-type, the implanted diffusion layer is P-type, and the impurity material in the third ion implantation is phosphorus.

6. A method for manufacturing semiconductor memory devices as claimed in claim 3, wherein the gate electrode is substantially oriented at a right angle with respect to the implanted diffusion layer formed in the second ion implantation.

7. A method for manufacturing semiconductor memory devices as claimed in claim 3, wherein a plurality of the implanted diffusion layers are arranged substantially parallel-spaced at equal intervals.

8. A method for manufacturing semiconductor memory devices as claimed in claim 3, wherein a plurality of the gate electrodes are arranged substantially parallel-spaced at equal intervals.

9. A method for manufacturing semiconductor memory devices as claimed in claim 3, wherein a silicon nitride layer is deposited on the intermediate layer before the oxidation of the impurity material in the calipers region in the step (7).

10. A method for manufacturing semiconductor memory devices as claimed in claim 3, wherein the gate electrode is comprised of a polycrystal silicon layer and tungsten silicide layer.

* * * * *